(12) United States Patent
Bryzek et al.

(10) Patent No.: US 9,586,813 B2
(45) Date of Patent: Mar. 7, 2017

(54) MULTI-DIE MEMS PACKAGE

(71) Applicant: Fairchild Semiconductor Corporation, San Jose, CA (US)

(72) Inventors: Janusz Bryzek, Oakland, CA (US); John Gardner Bloomsburgh, Oakland, CA (US); Cenk Acar, Newport Coast, CA (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/804,691

(22) Filed: Jul. 21, 2015

(65) Prior Publication Data

US 2015/0321904 A1    Nov. 12, 2015

Related U.S. Application Data

(62) Division of application No. 13/821,609, filed as application No. PCT/US2011/051994 on Sep. 16, 2011, now Pat. No. 9,095,072.

(Continued)

(51) Int. Cl.
    *B81B 7/00*    (2006.01)
    *B81C 1/00*    (2006.01)
    (Continued)

(52) U.S. Cl.
    CPC ............ *B81B 7/008* (2013.01); *B81C 1/0023* (2013.01); *H01L 23/481* (2013.01); *H05K 1/18* (2013.01);
    (Continued)

(58) Field of Classification Search
    CPC ....... B81C 1/0023; H01L 23/481; H05K 1/18; B81B 7/008
    See application file for complete search history.

(56) References Cited

U.S. PATENT DOCUMENTS 5,723,790 A    3/1998    Andersson
5,760,465 A    6/1998    Alcoe et al.
(Continued)

FOREIGN PATENT DOCUMENTS

CN    1068444 A    1/1993
CN    1198587 A    11/1998
(Continued)

OTHER PUBLICATIONS

"U.S. Appl. No. 12/849,742, Non Final Office Action mailed Mar. 28, 2013", 9 pgs.
(Continued)

*Primary Examiner* — John P Dulka
*Assistant Examiner* — Christina Sylvia
(74) *Attorney, Agent, or Firm* — Schwegman Lundberg & Woessner, P.A.

(57) ABSTRACT

This document refers to multi-die micromechanical system (MEMS) packages. In an example, a multi-die MEMS package can include a controller integrated circuit (IC) configured to couple to a circuit board, a MEMS IC mounted to a first side of the controller IC, a through silicon via extending through the controller IC between the first side and a second side of the controller IC, the second side opposite the first side, and wherein the MEMS IC is coupled to the through silicon via.

19 Claims, 4 Drawing Sheets

Related U.S. Application Data

(60) Provisional application No. 61/384,241, filed on Sep. 18, 2010, provisional application No. 61/384,321, filed on Sep. 20, 2010.

(51) Int. Cl.
*H01L 23/48* (2006.01)
*H05K 1/18* (2006.01)

(52) U.S. Cl.
CPC ............... *B81B 2201/0235* (2013.01); *B81B 2201/0242* (2013.01); *B81B 2201/0264* (2013.01); *B81B 2207/07* (2013.01); *H01L 2224/131* (2013.01); *H01L 2924/1461* (2013.01)

(56) References Cited

U.S. PATENT DOCUMENTS

| | | | |
|---|---|---|---|
| 6,214,644 B1 | 4/2001 | Glenn | |
| 6,366,468 B1 | 4/2002 | Pan | |
| 6,390,905 B1 | 5/2002 | Korovin et al. | |
| 6,504,385 B2 | 1/2003 | Hartwell | |
| 6,781,231 B2 | 8/2004 | Minervini et al. | |
| 6,848,304 B2 | 2/2005 | Geen | |
| 7,166,910 B2 | 1/2007 | Minervini et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,293,460 B2 | 11/2007 | Zarabadi et al. | |
| 7,301,212 B1 | 11/2007 | Mian et al. | |
| 7,358,151 B2 | 4/2008 | Araki et al. | |
| 7,436,054 B2 | 10/2008 | Zhe | |
| 7,449,355 B2 | 11/2008 | Lutz et al. | |
| 7,518,493 B2 | 4/2009 | Bryzek et al. | |
| 7,539,003 B2 | 5/2009 | Ray | |
| 7,544,531 B1 | 6/2009 | Grosjean | |
| 7,622,782 B2 | 11/2009 | Chu et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,851,925 B2 | 12/2010 | Theuss et al. | |
| 7,950,281 B2 | 5/2011 | Hammerschmidt | |
| 8,006,557 B2 | 8/2011 | Yin et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,421,168 B2 | 4/2013 | Allen et al. | |
| 8,710,599 B2 | 4/2014 | Marx et al. | |
| 8,739,626 B2 | 6/2014 | Acar | |
| 9,006,846 B2 | 4/2015 | Bryzek et al. | |
| 9,156,673 B2 | 10/2015 | Bryzek et al. | |
| 9,425,328 B2 | 8/2016 | Marx et al. | |
| 2002/0117728 A1 | 8/2002 | Brosnihan et al. | |
| 2003/0038415 A1 | 2/2003 | Anderson et al. | |
| 2003/0061878 A1 | 4/2003 | Pinson | |
| 2003/0222337 A1 | 12/2003 | Stewart | |
| 2004/0056742 A1* | 3/2004 | Dabbaj | H01G 5/18 335/78 |
| 2004/0119137 A1 | 6/2004 | Leonardi et al. | |
| 2004/0211258 A1 | 10/2004 | Geen | |
| 2004/0251793 A1 | 12/2004 | Matushisa | |
| 2005/0127499 A1* | 6/2005 | Harney | B81B 7/007 257/704 |
| 2005/0189635 A1 | 9/2005 | Humpston et al. | |
| 2006/0034472 A1 | 2/2006 | Bazarjani et al. | |
| 2006/0043608 A1 | 3/2006 | Bernier et al. | |
| 2006/0097331 A1 | 5/2006 | Hattori | |
| 2006/0207328 A1 | 9/2006 | Zarabadi et al. | |
| 2006/0246631 A1 | 11/2006 | Lutz et al. | |
| 2006/0284979 A1* | 12/2006 | Clarkson | A61B 5/061 348/143 |
| 2007/0013052 A1 | 1/2007 | Zhe et al. | |
| 2007/0040231 A1 | 2/2007 | Harney et al. | |
| 2007/0042606 A1 | 2/2007 | Wang et al. | |
| 2007/0047744 A1 | 3/2007 | Karney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0079120 A1 | 4/2008 | Foster et al. | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1 | 4/2008 | Acar | |
| 2008/0122439 A1 | 5/2008 | Burdick et al. | |
| 2008/0157301 A1 | 7/2008 | Ramakrishna et al. | |
| 2008/0169811 A1 | 7/2008 | Viswanathan | |
| 2008/0202237 A1 | 8/2008 | Hammerschmidt | |
| 2008/0245148 A1 | 10/2008 | Fukumoto | |
| 2008/0247585 A1 | 10/2008 | Leidl et al. | |
| 2008/0251866 A1 | 10/2008 | Belt et al. | |
| 2008/0290756 A1 | 11/2008 | Huang | |
| 2009/0085191 A1 | 4/2009 | Najafi et al. | |
| 2009/0140606 A1 | 6/2009 | Huang | |
| 2009/0166827 A1 | 7/2009 | Foster et al. | |
| 2009/0175477 A1 | 7/2009 | Suzuki et al. | |
| 2009/0183570 A1 | 7/2009 | Acar et al. | |
| 2009/0194829 A1* | 8/2009 | Chung | B81C 1/0023 257/415 |
| 2009/0263937 A1 | 10/2009 | Ramakrishna et al. | |
| 2009/0266163 A1 | 10/2009 | Ohuchi et al. | |
| 2010/0038733 A1 | 2/2010 | Minervini | |
| 2010/0044853 A1 | 2/2010 | Dekker et al. | |
| 2010/0072626 A1 | 3/2010 | Theuss et al. | |
| 2010/0155863 A1 | 6/2010 | Weekamp | |
| 2010/0224004 A1 | 9/2010 | Suminto et al. | |
| 2011/0030473 A1* | 2/2011 | Acar | G01C 19/5712 73/504.12 |
| 2011/0031565 A1 | 2/2011 | Marx et al. | |
| 2011/0121413 A1 | 5/2011 | Allen et al. | |
| 2011/0147859 A1 | 6/2011 | Tanaka et al. | |
| 2011/0201197 A1 | 8/2011 | Nilsson et al. | |
| 2011/0316048 A1 | 12/2011 | Ikeda et al. | |
| 2012/0126349 A1 | 5/2012 | Horning et al. | |
| 2012/0326248 A1 | 12/2012 | Daneman et al. | |
| 2013/0051586 A1 | 2/2013 | Stephanou et al. | |
| 2013/0099836 A1 | 4/2013 | Shaeffer et al. | |
| 2013/0270660 A1 | 10/2013 | Bryzek et al. | |
| 2013/0277773 A1* | 10/2013 | Bryzek | B81B 3/0086 257/415 |
| 2013/0341737 A1 | 12/2013 | Bryzek et al. | |
| 2014/0070339 A1 | 3/2014 | Marx | |
| 2014/0275857 A1 | 9/2014 | Toth et al. | |

FOREIGN PATENT DOCUMENTS

| | | |
|---|---|---|
| CN | 1221210 A | 6/1999 |
| CN | 1389704 A | 1/2003 |
| CN | 1816747 A | 8/2006 |
| CN | 1905167 A | 1/2007 |
| CN | 1948906 A | 4/2007 |
| CN | 101038299 A | 9/2007 |
| CN | 101171665 A | 4/2008 |
| CN | 101180516 A | 5/2008 |
| CN | 101239697 A | 8/2008 |
| CN | 101257000 A | 9/2008 |
| CN | 101316462 A | 12/2008 |
| CN | 101459866 A | 6/2009 |
| CN | 101519183 A | 9/2009 |
| CN | 101638211 A | 2/2010 |
| CN | 101639487 A | 2/2010 |

(56) References Cited

FOREIGN PATENT DOCUMENTS

| | | |
|---|---|---|
| CN | 101916754 A | 12/2010 |
| CN | 102337541 A | 2/2012 |
| CN | 102364671 A | 2/2012 |
| CN | 103209922 A | 7/2013 |
| CN | 103221332 A | 7/2013 |
| CN | 103663344 A | 3/2014 |
| CN | 203683082 U | 7/2014 |
| DE | 102013014881 A1 | 3/2014 |
| EP | 1688705 A2 | 8/2006 |
| EP | 1860402 A1 | 11/2007 |
| EP | 2053413 A1 | 4/2009 |
| KR | 1020110055449 A1 | 5/2011 |
| KR | 1020130052652 A | 5/2013 |
| KR | 1020130054441 A | 5/2013 |
| KR | 1020130057485 A | 5/2013 |
| KR | 101311966 B1 | 9/2013 |
| KR | 1020140034713 A | 3/2014 |
| TW | I255341 B | 5/2006 |
| WO | WO-2008059757 A1 | 5/2008 |
| WO | WO-2008087578 A2 | 7/2008 |
| WO | WO-2011016859 A2 | 2/2011 |
| WO | WO-2011016859 A3 | 2/2011 |
| WO | WO-2012037536 A2 | 3/2012 |
| WO | WO-2012037537 A2 | 3/2012 |
| WO | WO-2012040245 A2 | 3/2012 |
| WO | WO-2012040245 A3 | 3/2012 |

OTHER PUBLICATIONS

"U.S. Appl. No. 12/849,742, Non Final Office Action mailed Aug. 23, 2012", 9 pgs.

"U.S. Appl. No. 12/849,742, Notice of Allowance mailed Nov. 29, 2013", 7 pgs.

"U.S. Appl. No. 12/849,742, Response filed Jan. 23, 2013 to Non Final Office Action mailed Aug. 23, 2012", 10 pgs.

"U.S. Appl. No. 12/849,742, Response filed Sep. 30, 2013 to Non-Final Office Action mailed Mar. 28, 2013", 12 pgs.

"U.S. Appl. No. 12/849,742, Supplemental Notice of Allowability mailed Mar. 17, 2014", 3 pgs.

"U.S. Appl. No. 12/849,742, Supplemental Notice of Allowability mailed May 5, 2014", 2 pgs.

"U.S. Appl. No. 12/849,787, Non Final Office Action mailed May 28, 2013", 18 pgs.

"U.S. Appl. No. 12/849,787, Notice of Allowance mailed Dec. 11, 2013", 9 pgs.

"U.S. Appl. No. 12/849,787, Response filed Feb. 4, 2013 to Restriction Requirement mailed Oct. 4, 2012", 7 pgs.

"U.S. Appl. No. 12/849,787, Response filed Oct. 28, 2013 to Non Final Office Action mailed May 28, 2013", 12 pgs.

"U.S. Appl. No. 12/849,787, Restriction Requirement mailed Oct. 4, 2012", 5 pgs.

"U.S. Appl. No. 12/849,787, Supplemental Notice of Allowability mailed Mar. 21, 2014", 3 pgs.

"U.S. Appl. No. 12/947,543, Notice of Allowance mailed Dec. 17, 2012", 11 pgs.

"U.S. Appl. No. 13/821,586, Non Final Office Action mailed Jan. 15, 2015", 8 pgs.

"U.S. Appl. No. 13/821,586, Notice of Allowance mailed Jun. 5, 2015", 6 pgs.

"U.S. Appl. No. 13/821,586, Preliminary Amendment mailed Mar. 8, 2013", 6 pgs.

"U.S. Appl. No. 13/821,586, Response filed May 15, 2015 to Non Final Office Action mailed Jan. 15, 2015", 12 pgs.

"U.S. Appl. No. 13/821,586, Response filed Nov. 24, 2014 to Restriction Requirement mailed Sep. 22, 2014", 6 pgs.

"U.S. Appl. No. 13/821,586, Restriction Requirement mailed Sep. 22, 2014", 4 pgs.

"U.S. Appl. No. 13/821,589, Final Office Action mailed Mar. 12, 2015", 13 pgs.

"U.S. Appl. No. 13/821,589, Final Office Action mailed Jul. 17, 2015", 14 pgs.

"U.S. Appl. No. 13/821,589, Non Final Office Action mailed Jul. 9, 2014", 10 pgs.

"U.S. Appl. No. 13/821,589, Preliminary Amendment mailed Mar. 8, 2013", 6 pgs.

"U.S. Appl. No. 13/821,589, Response filed May 12, 2015 toFinal Office Action mailed Mar. 12, 2015", 12 pgs.

"U.S. Appl. No. 13/821,589, Response filed Oct. 19, 2015 to Final Office Action mailed Jul. 17, 2015", 10 pgs.

"U.S. Appl. No. 13/821,589, Response filed Nov. 10, 2014 to Non Final Office Action mailed Jul. 9, 2014", 15 pgs.

"U.S. Appl. No. 13/821,589, Response to Restriction Requirement mailed Apr. 11, 2014", 6 pgs.

"U.S. Appl. No. 13/821,589, Restriction Requirement mailed Apr. 11, 2014", 10 pgs.

"U.S. Appl. No. 13/821,609, Notice of Allowance mailed Mar. 23, 2015", 11 pgs.

"U.S. Appl. No. 13/821,609, Preliminary Amendment mailed Mar. 8, 2013", 3 pgs.

"U.S. Appl. No. 13/821,609, Response filed Feb. 13, 2015 to Restriction Requirement mailed Dec. 15, 2014", 6 pgs.

"U.S. Appl. No. 13/821,609, Restriction Requirement mailed Dec. 15, 2014", 7 pgs.

"U.S. Appl. No. 13/821,612, Non Final Office Action mailed Jul. 23, 2014", 8 pgs.

"U.S. Appl. No. 13/821,612, Notice of Allowance mailed Dec. 10, 2014", 8 pgs.

"U.S. Appl. No. 13/821,612, Preliminary Amendment mailed Mar. 8, 2013", 3 pgs.

"U.S. Appl. No. 13/821,612, Response filed Oct. 23, 2014 to Non Final Office Action mailed Jul. 23, 2014", 6 pgs.

"U.S. Appl. No. 13/821,793, Non Final Office Action mailed Jul. 27, 2015", 14 pgs.

"U.S. Appl. No. 13/821,793, Preliminary Amendment mailed Mar. 8, 2013", 3 pgs.

"U.S. Appl. No. 13/821,793, Response filed Oct. 27, 2015 to Non Final Office Action mailed Jul. 27, 2015", 12 pgs.

"U.S. Appl. No. 14/023,869, Non Final Office Action mailed Jun. 15, 2015", 15 pgs.

"Application Serial No. PCT/US2011/051994, International Republished Application mailed Jun. 7, 2012", 1 pg.

"Application Serial No. PCT/US2011/052417, International Republished Application mailed Jun. 7, 2012", 1 pg.

"Chinese Application Serial No. 2010800423190, Office Action mailed Mar. 26, 2014", 10 pgs.

"Chinese Application Serial No. 2010800423190, Office Action mailed Dec. 3, 2014", 3 pgs.

"Chinese Application Serial No. 2010800423190, Response filed Feb. 15, 2015 to Office Action mailed Dec. 3, 2014", 3 pgs.

"Chinese Application Serial No. 2010800423190, Response filed Aug. 11, 2014 to Office Action mailed Mar. 26, 2014", w/English Claims, 11 pgs.

"Chinese Application Serial No. 201180053926.1, Amendment filed Aug. 21, 2013", w/English Translation, 13 pgs.

"Chinese Application Serial No. 201180053926.1, Office Action mailed Jan. 13, 2014", 7 pgs.

"Chinese Application Serial No. 201180053926.1, Response filed Apr. 29, 2014 to Office Action mailed Jan. 13, 2014", w/English Claims, 10 pgs.

"Chinese Application Serial No. 201180055630.3, Office Action mailed Jul. 10, 2015", w/ English Claims, 8 pgs.

"Chinese Application Serial No. 201180055630.3, Office Action mailed Dec. 22, 2014", with English translation of claims, 10 pgs.

"Chinese Application Serial No. 201180055630.3, Response filed Sep. 25, 2015 to Office Action mailed Jul. 10, 2015", w/ English Claims, 14 pgs.

"Chinese Application Serial No. 201180055630.3, Response filed Apr. 20, 2015 to Office Action mailed Dec. 22, 2014", w/ English Claims, 10 pgs.

"Chinese Application Serial No. 201180055792.7, Office Action mailed Jul. 21, 2015", w/ English Translation, 5 pgs.

(56) References Cited

OTHER PUBLICATIONS

"Chinese Application Serial No. 201180055792.7, Office Action mailed Dec. 22, 2014", with English translation of claims, 10 pgs.
"Chinese Application Serial No. 201180055792.7, Response filed May 5, 2015 to Office Action mailed Dec. 22, 2014", w/ English Claims, 15 pgs.
"Chinese Application Serial No. 201180055794.6, Office Action mailed Dec. 17, 2014", with English translation of claims, 9 pgs.
"Chinese Application Serial No. 201180055794.6, Response filed May 4, 2015 to Office Action mailed Dec. 17, 2014", w/ English Claims, 15 pgs.
"Chinese Application Serial No. 201180055823.9, Office Action mailed Mar. 19, 2015", w/ English Claims, 8 pgs.
"Chinese Application Serial No. 201180055823.9,Response filed Aug. 3, 2015 to Office Action mailed Mar. 19, 2015", w/ English Translation, 14 pgs.
"Chinese Application Serial No. 201310415336.X, Office Action mailed Jul. 3, 2015", w/ English Claims, 9 pgs.
"Chinese Application Serial No. 201320565239.4, Office Action mailed Jan. 16, 2014", w/English Translation, 3 pgs.
"Chinese Application Serial No. 201320565239.4, Response filed Mar. 31, 2014 to Office Action mailed Jan. 16, 2014", w/English Claims, 38 pgs.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", (2005), 1 pg.
"European Application Serial No. 10806751.3, Extended European Search Report mailed Jan. 7, 2014", 7 pgs.
"European Application Serial No. 10806751.3, Response filed Jul. 24, 2014 to Office Action mailed Jan. 24, 2014", 26 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.
"European Application Serial No. 11826067.8, Extended European Search Report mailed Oct. 6, 2014", 10 pgs.
"European Application Serial No. 11826067.8, Response filed Apr. 27, 2015 to Extended European Search Report mailed Oct. 6, 2014", 32 pgs.
"European Application Serial No. 11826068.6, Extended European Search Report mailed Jul. 16, 2014", 10 pgs.
"European Application Serial No. 11826068.6, Response filed Feb. 9, 2015", 30 pgs.
"European Application Serial No. 11826069.4, Extended European Search Report mailed Jul. 23, 2015", 8 pgs.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Preliminary Report on Patentability mailed Mar. 28, 2013", 8 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
"Korean Application Serial No. 10-2013-0109990, Amendment filed Dec. 10, 2013", 4 pgs.
"Korean Application Serial No. 10-2013-7009775, Office Action mailed Sep. 17, 2013", w/English Translation, 6 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009788, Office Action mailed Aug. 29, 2013", w/English Translation, 6 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package—Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 13/821,589, Non Final Office Action mailed Feb. 8, 2016", 9 pgs.

(56) References Cited

OTHER PUBLICATIONS

"U.S. Appl. No. 13/821,589, Response filed May 9, 2016 to Non Final Office Action mailed Feb. 8, 2016", 7 pgs.
"U.S. Appl. No. 14/023,869 Response Filed Apr. 15, 2016 to Final Office Action mailed Dec. 15, 2015", 12 pgs.
"U.S. Appl. No. 14/023,869, Examiner Interview Summary mailed Apr. 19, 2016", 3 pgs.
"U.S. Appl. No. 14/023,869, Final Office Action mailed Dec. 15, 2015", 14 pgs.
"U.S. Appl. No. 14/023,869, Notice of Allowance mailed May 4, 2016", 8 pgs.
"U.S. Appl. No. 14/023,869, Preliminary Amendment filed Dec. 4, 2013", 3 pgs.
"U.S. Appl. No. 14/023,869, Response filed Nov. 16, 2015 to Non Final Office Action mailed Jun. 15, 2015", 12 pgs.
"Chinese Application Serial No. 201180055630.3, Office Action mailed May 16, 2016", (English Translation), 9 pgs.
"Chinese Application Serial No. 201180055630.3, Office Action mailed Dec. 7, 2015", W/ English Translation, 5 pgs.
"Chinese Application Serial No. 201180055630.3, Response filed Feb. 19, 2016 to Office Action mailed Dec. 7, 2015", W/ English Translation of Claim, 10 pgs.
"Chinese Application Serial No. 201310415336.X, Office Action mailed Apr. 26, 2016", w/ English Translation, 11 pgs.
"Chinese Application Serial No. 201310415336.X, Response filed Jan. 18, 2016 to Office Action mailed Jul. 3, 2015", (English Translation of Claims), 11 pgs.
"European Application Serial No. 11826043.9, Extended European Search Report mailed Feb. 23, 2016", 6 pgs.
"Korean Application Serial No. 2012-7005729, Office Action mailed May 3, 2016", w/ English Claims, 11 pgs.
"U.S. Appl. No. 13/821,589, Non Final Office Action mailed Sep. 9, 2016", 7 pgs.
"U.S. Appl. No. 15/218,852, Preliminary Amendment filed Jul. 27, 2016", 7 pgs.
"Chinese Application Serial No. 201180055630.3, Response filed Sep. 26, 2016 to Office Action mailed May 16, 2016", (With English Translation), 15 pgs.
"Chinese Application Serial No. 201180055794.6, Voluntary Amendment filed Jul. 7, 2015", with English translation of claims, 9 pgs.
"Chinese Application Serial No. 201310415336.X, Response filed Sep. 12, 2016 to Office Action mailed Apr. 26, 2016", W/ English Translation of Claims, 13 pgs.
"Korean Application Serial No. 2012-7005729, Response filed Jun. 29, 2016 to Office Action mailed May 3, 2016", (English Translation of Claims), 29 pgs.
U.S. Appl. No. 15/218,852, filed Jul. 25, 2016, Through Silicon via Including Multi-Material Fill.

\* cited by examiner ately supportconsumer applications.

MULTI-DIE MEMS PACKAGE

CLAIM OF PRIORITY

This application is a divisional of U.S. patent application Ser. No. 13/821,609, filed on May 20, 2013, which is a U.S. National Stage Filing under 35 U.S.C. 371 from International Patent Application Serial No. PCT/US2011/051994 filed on Sep. 16, 2011, and published on Mar. 22, 2012 as WO 2012/037492 A2 and republished on Jun. 7, 2012 as WO 2012/037492 A3, which claims the benefit of priority to U.S. Provisional Patent Application Ser. No. 61/384,241, entitled "Multi-Die Packaging of MEMS with Through Silicon Vias", filed Sep. 18, 2010, (Attorney Docket No.: 2921.096PRV), and also to U.S. Provisional Patent Application Ser. No. 61/384,321, entitled, "Integrated Inertial Sensor", filed Sep. 20, 2010, (Attorney Docket No.: 2921.0105PRV), which each are hereby incorporated by reference herein in their entirety.

BACKGROUND

Generally, applications using multiple microelectromechanical system (MEMS) chips include a separate controller for each MEMS chip. For example, an inertial sensor can be packaged with its own application specific integrated circuit (ASIC) while a pressure sensor is packaged with a separate ASIC. Because each additional MEMS chip includes an associated controller or controller circuitry, multiple MEMS systems can multiply the amount of power consumed, silicon and silicon real estate used, engineering resources used, and costs expended to produce the system. Additionally, some MEMS chips require high voltage signals. High voltage ASICs can be manufactured, but are expensive and not fully standardized. A MEMS requiring high voltage is stuck using an expensive ASIC, increasing the cost to levels that are not able support many consumer applications.

OVERVIEW

This document refers to multi-die micromechanical system (MEMS) packages. In an example, a multi-die MEMS package can include a controller integrated circuit (IC) configured to couple to a circuit board, a MEMS IC mounted to a first side of the controller IC, a through silicon via extending through the controller IC between the first side and a second side of the controller IC, the second side opposite the first side, and wherein the MEMS IC is coupled to the through silicon via.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
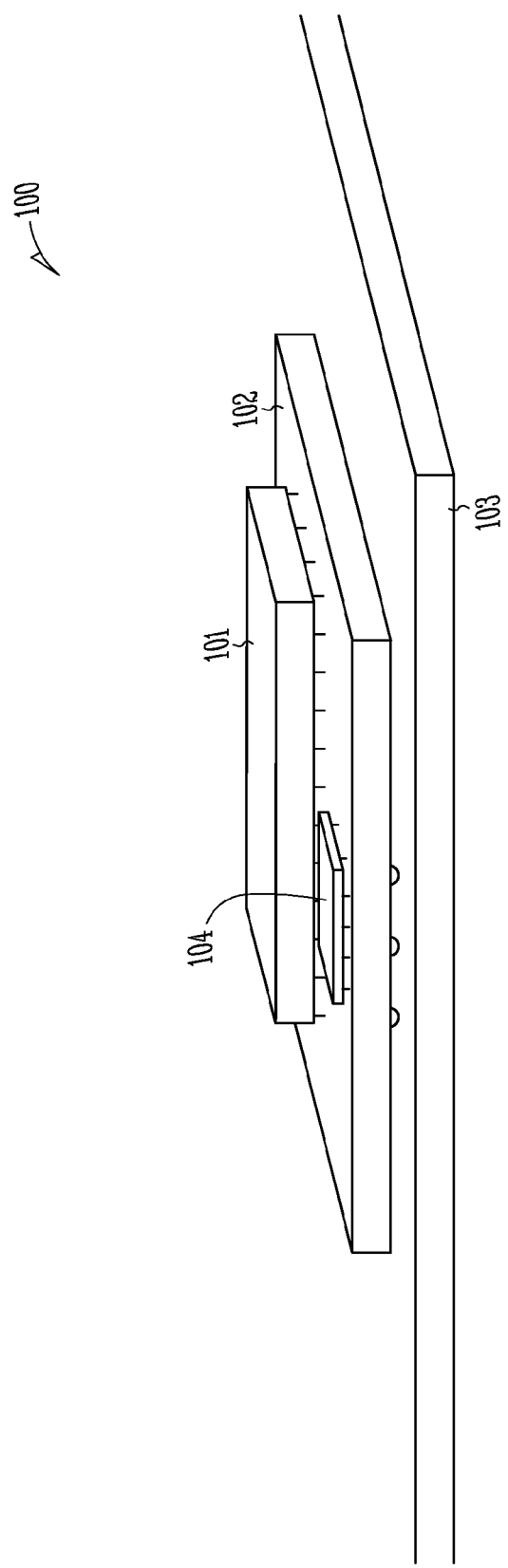
FIGS. 1-4 illustrate generally examples of multi-die MEMS packages.

FIG. 1 illustrates generally an example multi-die MEMS package 100 including a MEMS device 101 and a controller integrated circuit (IC) 102, such as an application-specific IC (ASIC). In certain examples, the MEMS device 101 is coupled to contacts on one side of the controller IC 102 and the controller IC 102 includes through silicon vias (TSVs) to couple the contacts to second contacts on the other side of the controller IC 102. The TSVs can eliminate wire bonds, and the area that accommodates the wire bonds, extending from the MEMS device 101 to the controller IC 102 or other circuitry, such as a printed circuit board (PCB) 103. In certain examples, the multi-die MEMS package 100 can reduce the package footprint of the overall device.

In certain examples, the multi-die MEMS package 100 can include a high voltage chip 104 mounted on top of the controller IC 102 proximate the MEMS device 101. In such an example, the high voltage chip 104 can provide the high voltage circuitry of the multi-die MEMS package 100 and the controller IC 102 can provide the low voltage circuitry of the multi-die MEMS package 100. In an example, multiple MEMS devices 101 can be mounted on top of, and coupled to, the controller IC 102, or to other circuitry, using through silicon vias (TSVs) of the controller IC 102.

Figure 2:
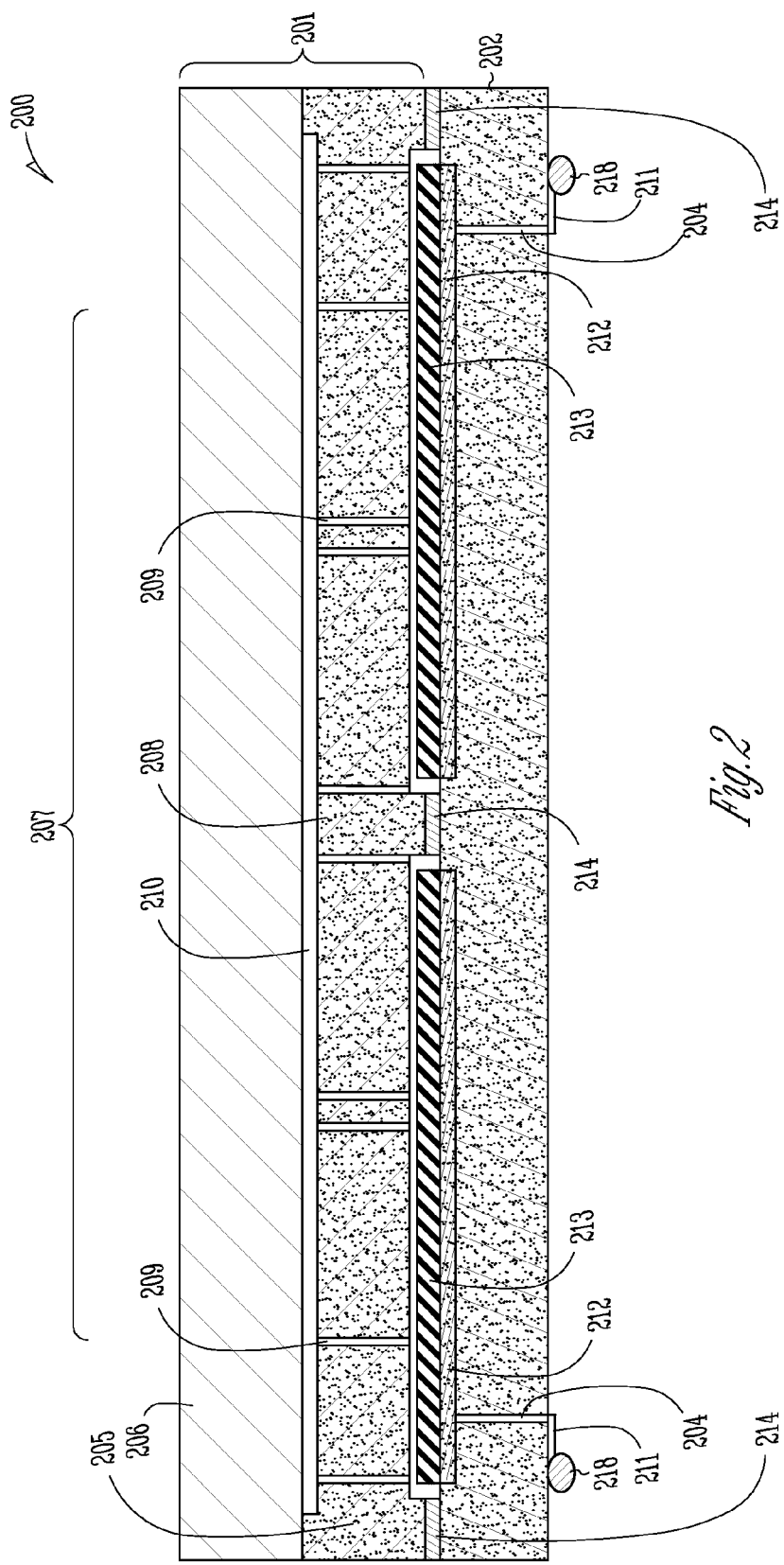

FIG. 2 illustrates an example of a multi-die MEMS package 200 including a MEMS device 201 and a controller IC 202 that includes TSVs 204. The MEMS device can include a device layer 205 and a cap layer 206. In an example, the device layer 205 can include a proof mass 207 supported by one or more an anchors 208. In an example, the device layer can include a proof mass supported by a single anchor. In certain examples, a MEMS IC can include more than one proof mass 207 within the device layer 205. The device layer 205, including the proof mass 207, can include gaps 209 extending in both vertical and horizontal directions through the device layer 205. The gaps 209 can form multiple moveable portions of a proof mass 207 and can allow in-plane movement and out-of-plane movement of the multiple portions, with respect to a major surface of the device layer 205. In an example, the in-plane movement and the out-of-plane movement of the proof mass 207 can be used to sense acceleration and rotation of the multi-die MEMS package 200. In certain examples, the device layer 205 can be etched to provide an inertial sensor with six degrees of freedom for sensing linear and angular acceleration of the MEMS package 200. In certain examples, the cap layer 206 can provide a portion of an environmental enclosure for the proof mass 207. In an example, a cavity 210 within the cap layer 206, or the device layer 205, can provide an area within which the proof mass 207 can move in the out-of-plane direction. In an example, the cap layer 206 can restrict out-of-plane movement of the proof mass 207, such as when the multi-die MEMS package 200 encounters a mechanical shock. In certain examples, the environmental enclosure housing the device layer 205 can maintain a vacuum about the moveable portions of the device layer 205.

In certain examples, the device layer 205 is bonded to a controller IC 202 such as an ASIC. In an example, the device layer 205, in cooperation with electrodes formed in the controller IC 202, such as electrodes formed in a passivation layer of the controller IC 202, can include differentials sensors for each axis of out-of-plane movement of the proof mass 207. In certain examples, the controller IC 202 can include one or more through silicon vias (TSVs) 204 to electrically couple signals from one side of the controller IC 202 to a different side of the controller IC 202. For example, the controller IC 202 can include a TSV 204 to couple an electrode of the MEMS device 201 located to one side of the controller IC 202 to a contact 211 located on the opposite side of the controller IC 202. In certain examples, the controller IC 202 can include a device layer 212. The device layer 212 can include integrated electronic circuitry, such as transistors, to process information related to the MEMS device 201. In an example, the device layer 212 of the controller IC 202 can provide control circuitry more than one MEMS device 201 mounted to the controller IC 202. In an example, the controller IC 202 can include a passivation layer 213 to protect the device layer 212. In certain examples, the passivation layer 213 can be used to form electrodes for the MEMS device 201.

In certain examples, a wafer bond metal 214 can couple a perimeter bond area of the device layer 205 to the controller IC 202. In an example, the wafer bond metal 214 can couple the single anchor 208 to the controller IC 202. In an example, the wafer bond metal 214 can couple the device layer 205, including the single anchor 208, directly to raw silicon of the controller IC 202. In an example, using a uniform bonding layer to bond the perimeter area of the device layer 205 and the anchor 208, and the ability to provide differential out-of-plane sensing, can result in improved rejection of thermal expansion effects and can reduce stress gradients of the bonded components. Improved rejection of thermal expansion effects and reduced stress gradients of the bonded components can both improve performance of the MEMS device 201.

In certain examples, the controller IC can include interconnects 218 to couple the multi-die MEMS package to other circuitry. In an example, the interconnects 218 can include solder bumps.

Figure 3:
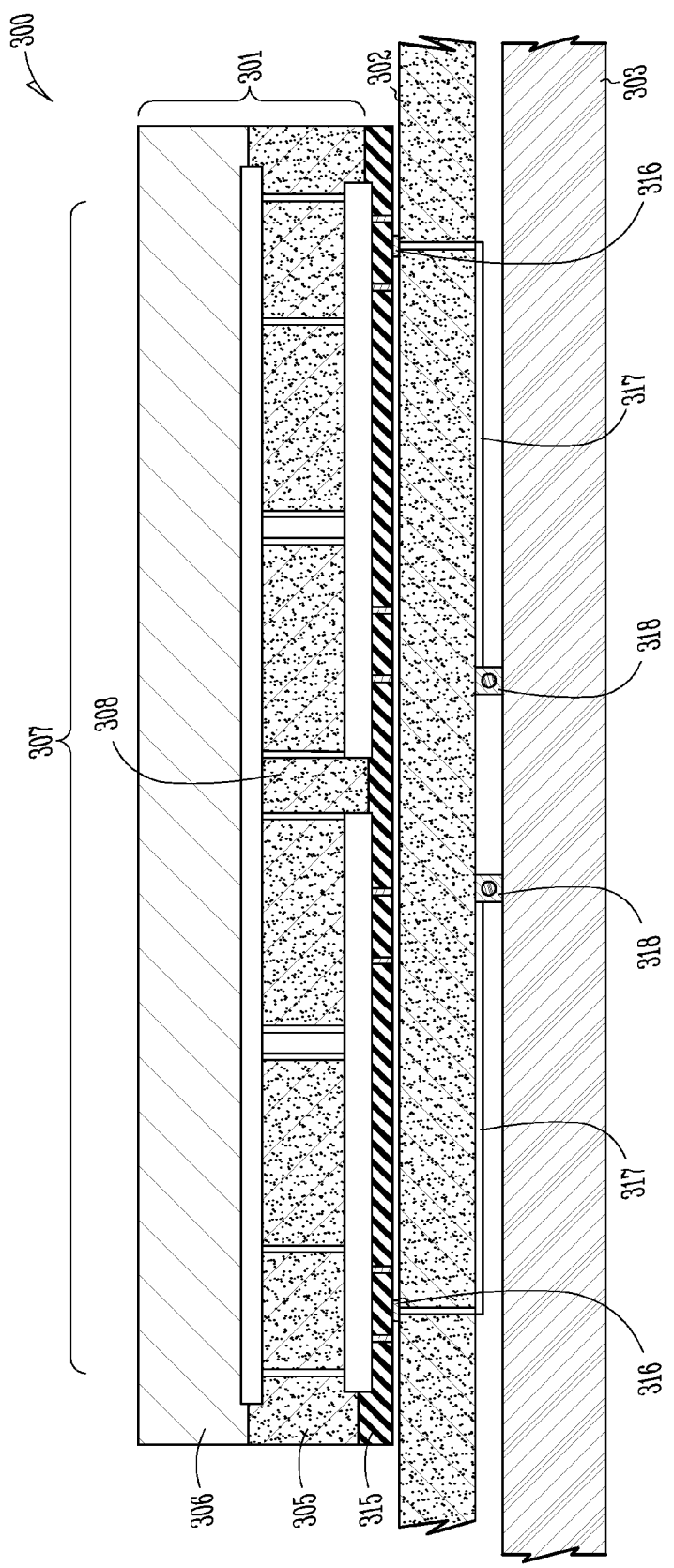

FIG. 3 illustrates generally an example multi-die MEMS package 300 including a MEMS device 301 and a controller IC 302 with through silicon vias (TSVs). The MEMS device 301 can include a device layer 305, a cap layer 306 and a via layer 315. In an example, the device layer 305 can include a MEMS structure including a proof mass 307 and a single anchor 308 configured to support the proof mass 307. In an example, the cap layer 306 and the via layer 315 can provide an environmental enclosure for the MEMS structure. In an example, the cap layer 306 and the via layer 315 can provide a stiff mechanical support for the MEMS structure such that components of the MEMS structure can be isolated from packaging stresses. In an example, the MEMS structure can be an inertial sensor structure. In an example, the MEMS structure can be a gyroscope sensor. In an example, the MEMS structure can be an accelerometer sensor. In certain examples, the MEMS structure can include one or more multi-axis, inertial sensors, such as, but not limited to, a 3-axis gyroscope, 3-axis accelerometer, or an integrated, multi-axis, gyroscope and accelerometer. In certain examples, the via layer 315 can include electrically isolated regions that provide electrodes for the MEMS structure and routing circuitry to couple the MEMS device to the controller IC 302, such as an ASIC. In certain examples, solder joints 316 between the via layer 315 and the controller IC 302 can be located at or near the outer edges of the via layer 315 such as near the perimeter of the via layer 315. Locating the solder joints 316 at the perimeter of the via layer 315 can reduce the influence of stress introduced when the controller IC 302 is mounted to other circuitry such as a printed circuit board (PCB) 303.

In an example, the controller IC 302 can include a redistribution layer 317, including conductive materials, to couple the controller IC 302, as well as the multi-die MEMS package 300, to other circuitry, such as the printed circuit board (PCB) 303. In an example, the redistribution layer 317 can include interconnects 318, such as for soldering to the PCB 303. The interconnects 318 can be clustered near the center of the controller IC 302 to reduce packaging stress communicated to the MEMS device 301 coupled to the controller IC 302. In certain examples, such as where a controller IC 302 supports more than one MEMS device, the interconnects can be clustered about the center of each footprint defined by the MEMS devices overlying the controller IC 302. In certain examples, interconnects for coupling the controller IC 302 of a multi-die MEMS package 300 can include polymer-core copper interconnects to further reduce packaging stress. In an example, the controller IC 302 and the PCB 303 can include a low stiffness boundary layer (SBL) to reduce stress introduced when the multi-die MEMS package 300 is electrically coupled to the PCB 303.

Figure 4:
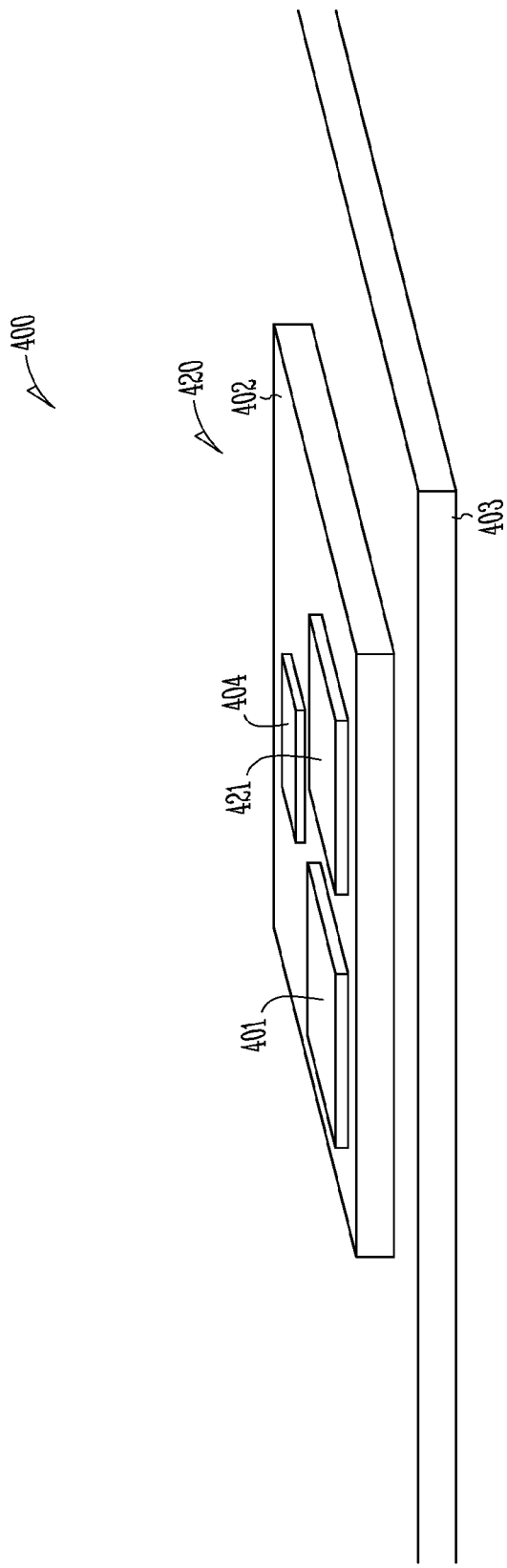

FIG. 4 illustrates generally a portion of an example system 400 including multiple MEMS devices 401, 421. In certain examples, the system 400 includes a MEMS package 420 mounted on a PCB 403. The MEMS package 420 can include a controller IC 402 such as an ASIC. The MEMS package 420 can include multiple MEMS devices 401, 421 mounted to the controller IC 402. Mounting multiple MEMS devices 401, 421 to a single controller IC 402 can save space otherwise used by a separate controller IC for each MEMS device. In an example, the MEMS package 420 can include a high voltage controller IC 404 that can provide a higher voltage to those MEMS devices of the system 400 that use a higher voltage than the technology used for the controller IC 402. In certain examples, a high voltage IC 404, such as a high voltage ASIC, can be used to drive a proof mass of a MEMS device layer to oscillate at a resonant frequency. Such movement of a MEMS structure can assist in detecting angular acceleration of the multi-die MEMS package 420. Such a configuration saves costs and footprint area associated with fabricating the entire controller IC using high voltage technology. In certain examples, the MEMS devices 401, 421 can include inertial sensors such as gyroscope sensors, and acceleration sensors, pressure sensors, compass sensors, etc. It is understood that a system can include additional MEMS sensors, as well as other devices, mounted to the controller IC 402 where the controller IC includes sufficient space and processing capabilities.

Additional Notes and Examples

In Example 1, an apparatus can include a controller integrated circuit (IC) configured to couple to a circuit board, a microelectromechanical system (MEMS) IC mounted to a first side of the controller IC, a through silicon via extending through the controller IC between the first side and a second side of the controller IC, the second side opposite the first side, and wherein the MEMS IC is coupled to the through silicon via.

In Example 2, the apparatus of Example 1 optionally includes a plurality of solder interconnects coupled to the circuit board and the control IC.

In Example 3, the MEMS IC of any one or more of Examples 1-2 optionally includes an inertial sensor.

In Example 4, the inertial sensor of any one or more of Examples 1-3 optionally includes an inertial sensor having six degrees of freedom.

In Example 5, the MEMS IC of any one or more of Examples 1-4 optionally includes a device layer having multiple moveable portions and a single anchor, the device layer configured to allow in-plane movement and out-of-plane movement of one or more of the moveable portions, and the single anchor configured to support the multiple moveable portions, and a cap layer couple to the device layer opposite the controller IC.

In Example 6, the inertial sensor of any one or more of Examples 1-5 optionally includes a via layer coupled to the device layer at a perimeter of the device layer and at the anchor, the via layer including electrically isolated regions configured to provide out-of-plane electrodes of the inertial sensor.

In Example 7, the device layer of any one or more of Examples 1-6 is optionally coupled directly to the controller IC at a perimeter of the device layer and at the single anchor.

In Example 8, the control IC of any one or more of Examples 1-7 optionally includes an application specific IC (ASIC).

In Example 9, the apparatus of any one or more of Examples 1-8 optionally includes a high voltage control IC configured to supply voltage to drive the MEMS IC into resonance.

In Example 10, the high voltage control IC of any one or more of Examples 1-9 is optionally mounted to the control IC.

In Example 11, the control IC of any one or more of Examples 1-10 optionally includes a first application specific IC (ASIC), and the high voltage control IC of any one or more of Examples 1-10 optionally includes a second ASIC.

In Example 12, an apparatus can include a microelectromechanical system (MEMS) integrated circuit (IC) and a controller IC. The MEMS IC can include a device layer having a plurality of gaps, the plurality of gaps forming multiple moveable portions and a single anchor, the single anchor configured to support the multiple moveable portions, and a cap layer coupled to the device layer and configured to maintain a vacuum about the multiple moveable portions and to limit out-of-plane movement of the multiple moveable portions. The controller IC have a first side coupled to the MEMS IC, and the controller IC can include a through silicon via extending through the controller IC from the first side to a second side of the controller IC. The through silicon via can be configured to electrically couple contacts located the first side of the controller IC with contacts located on the second side of the controller IC.

In Example 13, the MEMS IC of any one or more of Examples 1-12 optionally includes a via wafer coupled to the device layer opposite the cap layer, the via layer configured to electrically couple the device layer and the controller IC.

In Example 14, the controller IC of any one or more of Examples 1-13 is optionally directly coupled to the device layer at a perimeter of the device layer and at the single anchor.

In Example 15, the MEMS IC of any one or more of Examples 1-14 optionally includes an inertial sensor.

In Example 16, the MEMS IC of any one or more of Examples 1-15 optionally includes a three axis gyroscope sensor and a three axis accelerometer.

In Example 17, the three axis gyroscope sensor of any one or more of Examples 1-16 and the three axis accelerometer of any one or more of Examples 1-16 are optionally mechanically integrated within the device layer.

In Example 18, the apparatus of any one or more of Examples 1-17 optionally includes a MEMS pressure sensor IC coupled to the first side of the controller IC.

In Example 19, the apparatus of any one or more of Examples 1-18 is optionally includes a high voltage controller IC coupled to the first side of the controller IC proximate the MEMS IC, the high voltage controller IC configured to operate with higher voltages than the controller IC.

In Example 20, the controller IC of any one or more of Examples 1-19 is optionally includes an application-specific IC (ASIC).

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
a controller integrated circuit (IC) configured to couple to a circuit board;
a via layer mounted to a first side of the controller IC;
a device layer having multiple moveable portions and a single anchor, the device layer configured to allow in-plane movement and out-of-plane movement of one or more of the moveable portions, and the single anchor configured to support the multiple moveable portions; and
wherein the via layer is coupled to the device layer at a perimeter of the device layer and at the anchor, the via layer including electrically isolated regions configured to provide electrodes for out-of-plane movement of one or more of the multiple moveable portions.

2. The apparatus of claim 1, including a plurality of solder interconnects coupled to the circuit board and the control IC.

3. The apparatus of claim 1, wherein the apparatus includes an inertial sensor.

4. The apparatus of claim 3, wherein the inertial sensor includes an inertial sensor having six degrees of freedom.

5. The apparatus of claim 1, including
a cap layer couple to the device layer opposite the controller IC.

6. The apparatus of claim 5, wherein the device layer is coupled directly to the controller IC at a perimeter of the device layer and at the single anchor.

7. The apparatus of claim 1, wherein the controller IC includes an application specific IC (ASIC).

8. The apparatus of claim 1, including a high voltage controller IC configured to supply voltage to drive the device layer into resonance.

9. The apparatus of claim 8, wherein the high voltage controller IC is mounted to the controller IC.

10. The apparatus of claim 8, wherein the controller IC includes a first application specific IC (ASIC); and
wherein the high voltage controller IC includes a second ASIC.

11. An apparatus comprising:
a controller integrated circuit (IC) configured to couple to a circuit board;
a microelectromechanical system (MEMS) IC mounted to a first side of the controller IC;
a through silicon via extending through the controller IC between the first side and a second side of the controller IC, the second side opposite the first side;
wherein the MEMS IC is coupled to the through silicon via; and
a high voltage controller IC configured to supply voltage to drive the MEMS IC into resonance.

12. The apparatus of claim 8, wherein the high voltage controller IC is mounted to the controller IC.

13. The apparatus of claim 8, wherein the controller IC includes a first application specific IC (ASIC); and
wherein the high voltage controller IC includes a second ASIC.

14. The apparatus of claim 11, wherein the MEMS IC includes an inertial sensor.

15. The apparatus of claim 14, wherein the inertial sensor includes an inertial sensor having six degrees of freedom.

16. The apparatus of claim 11, wherein the MEMS IC includes:
a device layer having multiple moveable portions and a single anchor, the device layer configured to allow in-plane movement and out-of-plane movement of one or more of the moveable portions, and the single anchor configured to support the multiple moveable portions; and
a cap layer couple to the device layer opposite the controller IC.

17. The apparatus of claim 16, wherein the inertial sensor includes a via layer coupled to the device layer at a perimeter of the device layer and at the anchor, the via layer including electrically isolated regions configured to provide out-of-plane electrodes of the inertial sensor.

18. The apparatus of claim 16, wherein the device layer is coupled directly to the controller IC at a perimeter of the device layer and at the single anchor.

19. The apparatus of claim 11, wherein the controller IC includes an application specific IC (ASIC).

* * * * *